(12) United States Patent
Shimizu

(10) Patent No.: US 9,103,892 B2
(45) Date of Patent: Aug. 11, 2015

(54) GROUND FAULT DETECTOR

(75) Inventor: Takumi Shimizu, Yokkaichi (JP)

(73) Assignee: DENSO CORPORATION, Kariya (JP)

( * ) Notice: Subject to any disclaimer, the term of this patent is extended or adjusted under 35 U.S.C. 154(b) by 219 days.

(21) Appl. No.: 13/612,951

(22) Filed: Sep. 13, 2012

(65) Prior Publication Data
US 2013/0106432 A1    May 2, 2013

(30) Foreign Application Priority Data

Oct. 26, 2011 (JP) ................................ 2011-235271

(51) Int. Cl.
*G01R 31/08* (2006.01)
*G01R 31/02* (2006.01)
*G01R 31/36* (2006.01)
*G01R 31/00* (2006.01)

(52) U.S. Cl.
CPC .......... *G01R 31/3627* (2013.01); *G01R 31/006* (2013.01); *G01R 31/025* (2013.01)

(58) Field of Classification Search
CPC ............ G01R 31/025; G01R 31/3606; G01R 31/024; G01R 31/08; G01R 31/026
USPC ......... 324/503–510, 512, 522–523, 525, 426, 324/537, 691; 361/49, 42, 44, 47, 115, 102
See application file for complete search history.

(56) References Cited

U.S. PATENT DOCUMENTS

| | | | |
|---|---|---|---|
| 6,320,389 B1 | 11/2001 | Tamesue et al. | |
| 6,906,525 B2* | 6/2005 | Suzuki | 324/509 |
| 7,773,353 B2* | 8/2010 | Uchida | 361/49 |
| 2004/0130326 A1* | 7/2004 | Yamamoto | 324/503 |
| 2004/0243288 A1 | 12/2004 | Kito et al. | |
| 2011/0304339 A1* | 12/2011 | Schumacher et al. | 324/509 |
| 2012/0086458 A1* | 4/2012 | Wei et al. | 324/509 |

FOREIGN PATENT DOCUMENTS

| | | |
|---|---|---|
| JP | 10-221395 | 8/1998 |
| JP | 2004-53365 | 2/2004 |
| JP | 2004-354247 | 12/2004 |
| JP | 2005-57961 | 3/2005 |
| JP | 2007-147391 | 6/2007 |
| JP | P4017770 | 12/2007 |
| JP | P4122858 | 7/2008 |

OTHER PUBLICATIONS

Office Action (2 pgs.) dated Sep. 17, 2013 issued in corresponding Japanese Application No. 2011-235271 with an at least partial English-language translation thereof (3 pgs.).

* cited by examiner

*Primary Examiner* — Arleen M Vazquez
*Assistant Examiner* — Neel Shah
(74) *Attorney, Agent, or Firm* — Nixon & Vanderhye P.C.

(57) ABSTRACT

A ground fault detector which does not need complicated circuitry and can detect a ground fault with high accuracy in conformity to a capacitance of a common mode capacitor is presented. Upon judging the ground fault on the basis of a threshold for a high-tension power supply system which is electrically isolated and mounted in a vehicle, a controller in a ground fault detector alters the threshold in conformity to a capacitance of a common mode capacitor of which value is different between a first state that a system main relay is ON and a second state that the system main relay is OFF, thereby judges the ground fault on the basis of the altered threshold. Thus the ground fault detector can adequately detect the ground fault in conformity to the capacitance of the common mode capacitor. Thus the detector can detect the ground fault with accuracy without complicated circuitry.

8 Claims, 3 Drawing Sheets

US 9,103,892 B2

GROUND FAULT DETECTOR

CROSS-REFERENCE TO RELATED APPLICATION

This application is based on and claims the benefit of priority from earlier Japanese Patent Application No. 2011-235271 filed Oct. 26, 2011, the description of which is incorporated herein by reference.

BACKGROUND

1. Technical Field of the Invention

The present invention relates to a ground fault detector.

2. Related Art

For example, Japanese registered patent No. 4,017,770 teaches an electric leakage detector. This detector decides an electric leakage exists or not on the basis of calculating a resistance component from an electric leakage admittance and compensation of a capacitance component of a vehicle' body. The detecting method relies on a highly secure alternating current. Specifically the electric leakage detector calculates a real part of the electric leakage admittance, i.e. a resistance component, and then compares the resistance component to a certain threshold corresponds to a criterion for the leakage of electricity.

Still, Japanese registered patent No. 4,122,858 teaches another electric leakage detector. This detector detects the location of an electric leakage. More specifically the device includes multiple electric leakage detecting circuits and each circuit is respectively connected to certain portions, e.g. an inverter, through a relay. This electric leakage detector detects in which line(s) leakage of electricity occurs by means of providing separate electric leakage detecting circuits.

However, the method based on Japanese registered patent No. 4,017,770 has such a problem that the detector needs a circuit for detecting a phase difference in order to detect the admittance component. Thus the detector becomes complicated.

Though both a high-tension power supply system and a high-tension device like an inverter are commonly connected to each other by a relay, a capacitance of a common mode capacitor may be altered significantly by the relay being switched ON or OFF. The capacitance of a common mode capacitor herein means an actual capacitance of devices in the vehicle and/or its stray capacitance. Therefore the degree of the ground fault may be altered by the relay being switched ON or OFF. If the magnitude of capacitance of the common mode capacitor is larger, the amount of change of the capacitance of the common mode capacitor by the relay being switched ON or OFF may become larger. Accordingly, the user actually cannot find a location of a ground fault exactly as disclosed in Japanese registered patent No. 4,122,858.

Therefore, in the light of conditions set forth above, it is needed to provide such a ground fault detector which does not need complicated circuitry and can detect the ground fault with high accuracy in conformity to the capacitance of the common mode capacitor.

SUMMARY

A ground fault detector is disclosed. The ground fault detector judges, on the basis of multiple thresholds, a ground fault of a high-tension power supply system being electrically isolated and mounted in a vehicle. Specifically the detector includes a judging means for judging the ground fault. The judging means selects an adequate and applicable threshold on the basis of the state of the vehicle (e.g. the capacitance of the common mode capacitor connected to the high tension power supply system) and judges the ground fault on the basis of the adequately and applicably selected threshold. According to the present detector, since the detector judges a ground fault on the basis of the threshold conformable to the vehicle's state, the detector can adequately judge a ground fault in conformity to the vehicle's state even though the vehicle's state may change. Thus the present detector can detect a ground fault with high accuracy without complicated circuitry.

DETAILED DESCRIPTION OF THE PREFERRED EMBODIMENTS

Exemplary embodiments will be explained below with reference to figures.

First Embodiment

To begin with, a first exemplary embodiment will be explained with reference to figures. A ground fault detector of the first embodiment is a device for detecting of a ground fault for such an instrument as a high-tension battery. For example the ground fault detector of the first embodiment is available to detect a ground fault for a high-tension power supply system in electric vehicles such as hybrid cars.

Figure 1:
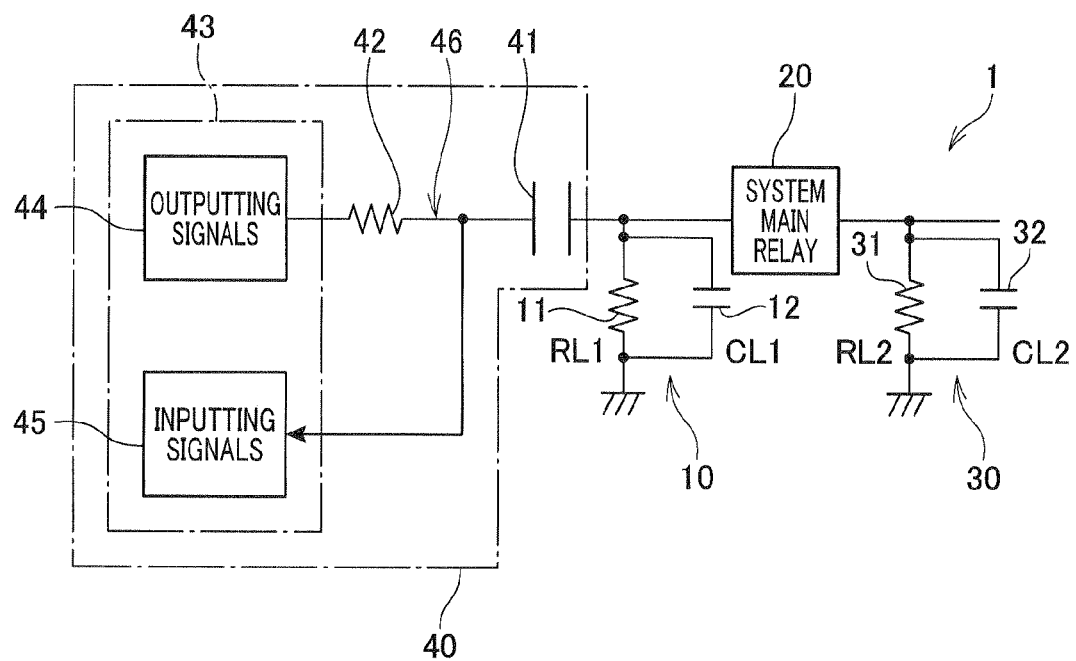
FIG. 1 shows circuitry of a ground fault detecting system which includes a ground fault detector corresponding to the first embodiment.

FIG. 1 shows circuitry of a ground fault detecting system. As shown in FIG. 1, a ground fault detecting system 1 includes a high-tension power supply system 10, a system main relay 20, one or more items of vehicle equipment 30 and a ground fault detector 40.

The vehicle equipment 30 includes electric apparatuses being mounted in vehicles.

The high-tension power supply system 10 is actually comprised of a battery consisting of lithium-iron cells arranged in series. The lithium-iron cells can be recharged, thereby the high-tension power supply system 10 generates high voltage e.g. about 300-volt. In FIG. 1, the high-tension power supply system 10 is shown with an equivalent circuit for a parallel circuit which is comprised of a resistance 11 and a capacitor 12 mutually connected in parallel. A capacitance (CL1) of the capacitor 12 is nearly equal to zero.

The system main relay 20 is used for connecting the high-tension power supply system 10 to the vehicle equipment 30 and controlling power supply from the high-tension power supply system 10 to the vehicle equipment 30. The vehicle equipment 30 is a load such as an inverter and/or DC-DC converter which works by voltage supplied from the high-tension power supply system 10.

Multiple vehicle equipment actually exists in the ground fault detecting system 1. In FIG. 1, whole vehicle equipment is shown collectively with one equivalent circuit for a parallel circuit being comprised of a resistance 31 and a capacitor 32 mutually connected in parallel. A capacitance (CL2) of the capacitor 32 is about 0.1~0.2 µF for anti-noise measures. This capacitance CL2 corresponds to a capacitance of the common mode capacitor. Thus, since the capacitance of the common mode capacitor actually accompanies with the vehicle equipments, the capacitance of the common mode capacitor may be altered on the basis of ON or OFF of the system main relay 20.

The ground fault detector 40 provides a capacitor 41, a resistance 42 and a controller 43.

The capacitor 41 functions for isolating between the high-tension power supply system 10 mounted in a vehicle at the sate of isolated and the ground fault detector 40. One of two electrodes, hereinafter referred to as "first electrode", of the capacitor 41 is connected to the high-tension power supply system 10, and another electrode, hereinafter referred to as "second electrode", of the capacitor 41 is connected to the resistance 42.

The controller 43 detects a ground fault in the high-tension power supply system 10. The controller 43 provides a signal output portion 44, a signal input portion 45, an A-D converter and a microcomputer. Both the A-D converter and the microcomputer are not shown in FIG. 1.

The signal output portion 44 is a circuit generates and outputs a square wave. Square waves are output to a pathway 46 in which the capacitor 41 is connected through the resistance 42. The pathway 46 is an electrical wiring which connects between the high-tension power supply system 10 and the resistance 42, more specifically connects between the second electrode of the capacitor 41 and the resistance 42.

The signal input portion 45 is a circuit which receives responses from the pathway 46 as a detecting signal. More specifically, the signal input portion 45 receives a voltage of a connecting point between the resistance 42 and the capacitor 42 as the detecting signal. The signal input portion 45 outputs the received detecting signal to the A-D converter.

The A-D converter converts the detecting signal detected by the signal input portion 45 to digital signal and outputs the digital signal to the microcomputer. The microcomputer compares the detecting signal received from the A-D converter to a threshold for judging of the ground fault, and detects whether the ground fault has occurred or not. The threshold for judging of the ground fault is hereinafter merely called "threshold".

Microcomputer alters the threshold on the basis of the state of a vehicle, thereby detects whether the ground fault has occurred or not on the basis of the altered threshold. In this point, "the state of a vehicle" means a capacitance of the common mode capacitor, and especially in this embodiment means both states that the system main relay 20, which is connected between the high-tension power supply system 10 and the vehicle equipment 30, may be ON or OFF.

As mentioned above, the capacitance of the common mode capacitor can be altered on the basis of the state of the system main relay 20. Therefore, if the system main relay 20 is OFF, the microcomputer judges whether the ground fault has occurred on the basis of the first threshold conformable to the capacitance of the common mode capacitor in the state that the system main relay 20 is OFF. On the other hand, if the system main relay 20 is ON, the microcomputer judges whether the ground fault has occurred on the basis of the second threshold conformable to the capacitance of the common mode capacitor in the state that the system main relay 20 is ON. Thus the microcomputer alters the threshold on the basis of the state of the system main relay 20, and then detects the ground fault on the basis of the altered threshold. These thresholds have been provided within the microcomputer. Above-mentioned are the structure of the ground fault detecting system 1 including the ground fault detector 40.

Figure 2:
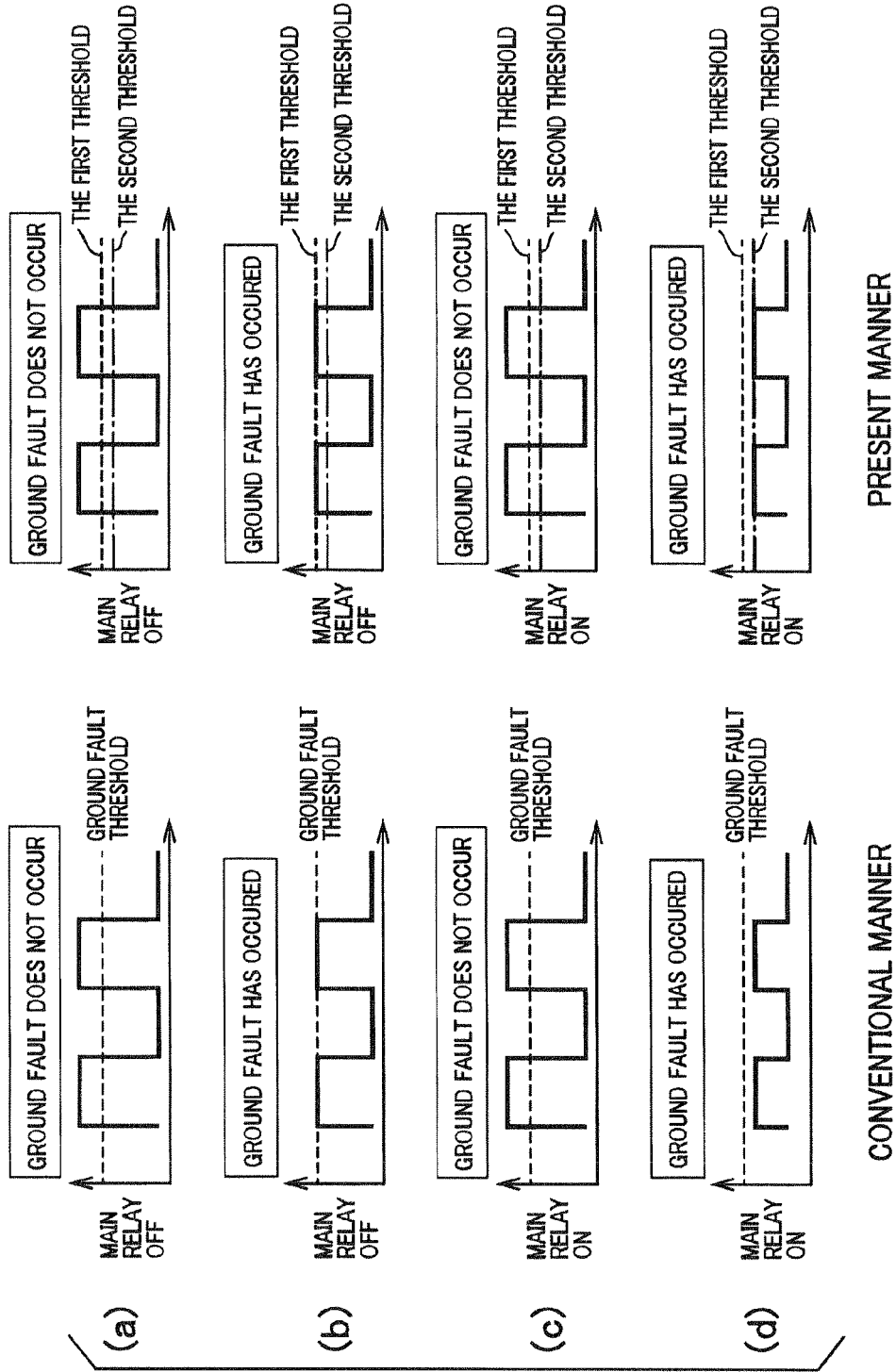
FIG. 2 shows an operation of the ground fault detector.

Next, a detecting method of the ground fault by the ground fault detector 40 will be disclosed with the reference of FIG. 2. The left section in FIG. 2 shows signal waveform which appears in the case of a conventional manner of which threshold cannot be altered on the basis of the vehicle's state. The right section in FIG. 2 shows signal waveform which appears respectively at the signal output portion 44 and the signal input portion 45 in the ground fault detector 40 of present embodiment shown in FIG. 1.

As in the left section in FIG. 2($a$), ($b$), in the case where a conventional detector detects on the basis of only one threshold, the conventional detector cannot detect the degree of the ground fault since one threshold is only provided and the threshold has set in advance taking into consideration the standardized alteration of the capacitor of the common mode capacitor.

On the contrary, as in the right section in FIG. 2 relating to the present embodiment, two thresholds, the first threshold and the second threshold, are provided. The first threshold is applied in the case that the system main relay 20 is OFF and the second threshold is applied in the case that the system main relay 20 is ON. The value of the first threshold and the second threshold differ from each other. More specifically the first threshold is larger than the second threshold.

As in the right section in FIG. 2 ($a$) relating to the present embodiment, in the case where the system main relay 20 is OFF and the ground fault has not occurred, the ground fault is not detected since amplitude of the detected signal is larger than the first threshold. Still more, as in the right section in FIG. 2 ($b$), in the case where the ground fault has occurred, a decrease of amplitude of square wave may be rapidly detected on the basis of the first threshold (less than the second threshold) applied to the state that the system main relay 20 is OFF.

In the case of the conventional manner as shown in the left section in FIG. 2($c$) and FIG. 2 ($d$), the ground fault cannot be exactly detected. The reason is as follows. Firstly, even though the ground fault may incorrectly not be detected since the threshold has been set higher taking into consideration the altering of the capacitance of the common mode capacitor, the judging may be done only under such condition that the applicable threshold has no flexibility for detecting the ground fault correctly. Secondly, if the ground fault is detected, it may be detected at an early stage on the basis of the threshold previously has been set higher.

On the other hand, as the present embodiment shown in the right section in FIG. 2 ($c$), in the case where the system main relay 20 is ON and the ground fault has not occurred, the ground fault is not detected since amplitude of the detected signal is larger than the second threshold. Still more, as in the right section in FIG. 2 ($d$), in the case where the ground fault has occurred, using the second threshold applied to the state that the system main relay 20 is ON, a decrease of amplitude of square wave can be detected under such conditions that the applicable threshold has flexibility.

As mentioned above, the first embodiment of the present invention is characterized by altering to or selecting of the threshold in conformity to the capacitor of the common mode capacitor correspond to the state (ON or OFF) of the system main relay 20 i.e. the state of the vehicle.

In this way, since the ground fault detector 40 may judge the ground fault using the adequate threshold conformable to a capacitance of the common mode capacitor, even though the state of the system main relay 20 may change, the ground fault detector 40 can adequately judge the ground fault on the basis of the state of the system main relay 20. Thus the detector 40 can detect a ground fault with high accuracy without complicated circuitry.

Furthermore, according to the present embodiment, the user can easily judge the ground fault with high accuracy on condition that two thresholds, respectively applied to the state that the system main relay 20 is ON, or OFF, have been set in the microcomputer.

Incidentally, the term "a judging means" shall be construed as the controller 43 including a microcomputer.

Second Embodiment

Next, second embodiment will be disclosed. In this embodiment, only the contents which differ from the first embodiment will be explained. In the first embodiment, loads connected to the system main relay 20 are called "vehicle equipment(s)" all together. However, many kind of inverters may be actually mounted in vehicles. Therefore, in this embodiment, "the state of the vehicle" shall be defined on the basis of a kind of inverter mounted in the vehicle.

Since the capacitance of the common mode capacitor depends on the inverter, the capacitance of the common mode capacitor may have various values corresponding to the kind of inverter or the number of inverters. The inverter has various use such as driving of cars, electric generation, rear wheels and cooler compressors. Still more, the inverter may have also different value of a capacitance (CL2) of the common mode capacitor corresponding to a kind of inverter such as large capacitance, middle capacitance and small capacitance.

Accordingly, the user can conduct a highly accurate ground fault detecting process conformable to the kind of inverters by setting a plural threshold conformable to the kind of inverter and altering to the threshold conformable to the inverter. Further more, using such a structure that the high-tension power supply system 10 is connected through the system main relay 20 like the first embodiment mentioned above, the detector 40 of this second embodiment is not influenced by the variance between vehicles since the ground fault detector 40 can alter the threshold in conformity to not only ON or OFF of the system main relay 20 but also the kind of inverters.

Third Embodiment

Figure 3:
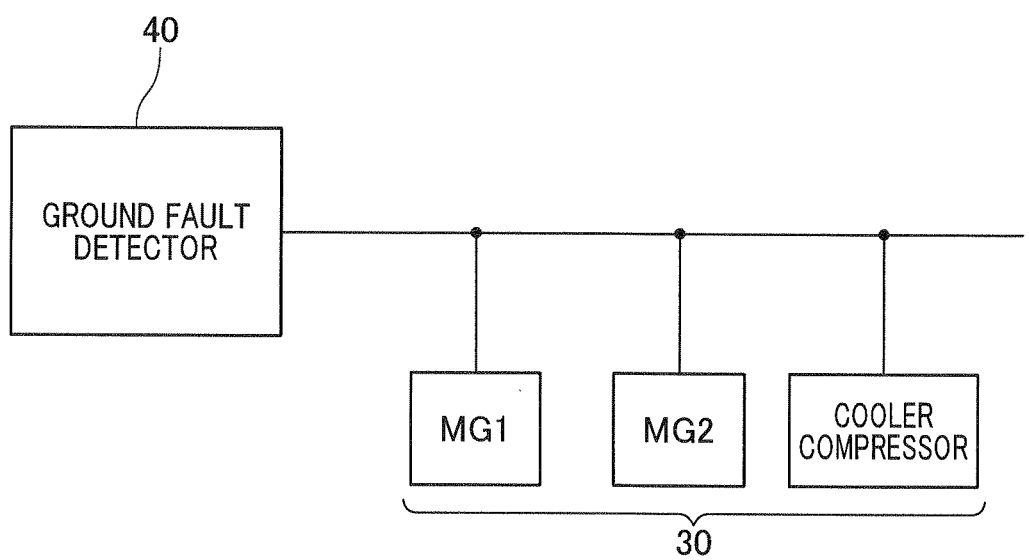
FIG. 3 shows a circuitry of a ground fault detecting system which includes a ground fault detector corresponding to the third embodiment.

Next, a third embodiment will be disclosed. In this embodiment, only the contents which differ from the first embodiment will be explained also. FIG. 3 shows a communication system which includes a ground fault detector 40 based on this third embodiment. As shown in FIG. 3, the communication system includes multiple vehicle equipment 30. The multiple items of vehicle equipment 30 and controller 43 are connected to be able to communicate each other.

Each of multiple vehicle equipment 30 is connected to a high-tension power supply system 10 as in the first and second embodiment. The vehicle equipment 30 is such an inverter as used in a motor (MG1, MG2) or cooler compressor in vehicles.

Each of the vehicle equipments 30 stores a capacitance of its common mode capacitor as the state of itself and is set so as to transmit the capacitance of its common mode capacitor to the controller 43. Thus the microcomputer in the controller 43 detects the ground fault by means of altering to the threshold conformable to the capacitance of the common mode capacitor received from each of the vehicle equipments 30. The transmitting timing and/or the number of transmitting times from each of the vehicle equipments 30 can be set suitably.

For the purpose of this manner, the microcomputer stores a map in which the threshold conformable to the capacitance of the common mode capacitor has been set, thereby the microcomputer selects the threshold conformable to the capacitance of the common mode capacitor using the map. Thus, according to this embodiment, by receiving the capacitance (CL2) of the common mode capacitor from each item of vehicle equipment 30, the ground fault detector 40 can detect the ground fault with high accuracy on the basis of the optimum threshold conformable to the capacitance of the common mode capacitor of the vehicle equipment 30 connected to the high-tension power supply system 10.

Still more, one may construct the controller 43 so as to learn the threshold conformable to the capacitance of the common mode capacitor by making the controller 43 store the value of the capacitance of the common mode capacitor at the time when the microcomputer received them from each of the vehicle equipments 30.

Modification

The construction of the ground fault detector 40 mentioned-above is merely an example, that is, the present invention shall not be limited to above-mentioned structure. For example, one may construct the microcomputer included in the controller 43 to simulate a decrease in insulation resistance in the high-tension power supply system 10 by simulating a ground fault in the high-tension power supply system 10, thereby judging normal or abnormal on the basis of the simulated decrease in insulation resistance. For the purpose of this manner, it is desirable that one provides a circuit in the ground fault detector 40 for simulating a decrease in insulation resistance. If the detector 40 is judged normal, the user may understand that the judged portion is safe to touch. On the contrary, if the detector 40 is judged abnormal, the user may understand that the judged portion is dangerous to touch. Upon the judging of normal or abnormal, since the detector 40 detects the ground fault on the basis of the threshold altered in conformity to the state of the vehicle, the accuracy of the judging of the ground fault for the portion regarded as safe can be improved.

The invention claimed is:

1. A ground fault detection system for judging a ground fault, on the basis of a threshold for judging a ground fault, for a high-tension power supply system which is mounted in a vehicle in an electrically insulated state, the ground fault detection system including:
   a judging means to alter the threshold on the basis of a state of the vehicle and judge the ground fault on the basis of the altered threshold; and
   a plurality of vehicle equipment which are connected to the high tension power supply system,
   wherein:
   each of the plurality of vehicle equipment and the judging means is mutually connected so as to communicate;
   each of the plurality of vehicle equipment is configured to store a value of capacitance of its common mode capacitor as the state of the vehicle and to transmit the value of capacitance of its common mode capacitor to the judging means; and
   the judging means alters the threshold in conformity to the value of the capacitance of the common mode capacitor received from each of the plurality of vehicle equipment.

2. A ground fault detection system according to claim 1, wherein the state of the vehicle includes both of the states in which a system main relay is ON and OFF, wherein the system main relay is connected between the high-tension power supply system and a vehicle equipment.

3. A ground fault detection system according to claim 2, wherein the state of the vehicle depends on a kind of inverter which corresponds to the vehicle equipment and is connected to the high-tension power supply system.

4. A ground fault detection system according to claim 1, wherein the judging means simulates a decrease in insulation resistance in the high-tension power supply system by simulating a ground fault in the high-tension power supply system, and judges whether the power supply system is normal or abnormal on the basis of the simulated decrease in insulation resistance.

5. A ground fault detecting method based on a threshold for judging a ground fault for a high-tension power supply system mounted in a vehicle in an electrically insulated state, the ground fault detecting method including:
   altering the threshold on the basis of a state of the vehicle; and
   judging the ground fault on the basis of the altered threshold, wherein:
   the said altering the threshold further depends on a value of a capacitance of a common mode capacitor received from a plurality of vehicle equipment, and the ground fault detecting method further includes: storing in each of the plurality of vehicle equipment the value of the capacitance of its common mode capacitor and using the value stored in in each of the plurality of vehicle equipment to alter the threshold.

6. A ground fault detecting method according to claim 5, wherein the state of the vehicle includes both of the states in which a system main relay, which is connected between the high-tension power supply system and a vehicle equipment, is ON and OFF.

7. A ground fault detecting method according to claim 6, wherein said altering the threshold depends on a kind of inverter as the vehicle equipment, which is connected to the high-tension power supply system.

8. A ground fault detecting method according to claim 5, wherein said judging the ground fault depends on a decrease in insulation resistance simulated in the high-tension power supply system.

* * * * *